(12) United States Patent
Kitano et al.

(10) Patent No.: US 6,875,281 B2
(45) Date of Patent: Apr. 5, 2005

(54) METHOD AND SYSTEM FOR COATING AND DEVELOPING

(75) Inventors: Junichi Kitano, Nirasaki (JP); Yuji Matsuyama, Kikuchi-gun (JP); Takahiro Kitano, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 336 days.

(21) Appl. No.: 09/849,259

(22) Filed: May 7, 2001

(65) Prior Publication Data

US 2002/0127340 A1 Sep. 12, 2002

(30) Foreign Application Priority Data

May 11, 2000 (JP) ........................................ 2000-138213

(51) Int. Cl.[7] ........................ C23C 16/000; B65G 49/07
(52) U.S. Cl. ...................... 118/719; 118/665; 118/696; 414/935
(58) Field of Search ................................ 118/665, 696, 118/699, 715–733, 50, 64, 712

(56) References Cited

U.S. PATENT DOCUMENTS

| | | | | |
|---|---|---|---|---|
| 4,425,075 A | * | 1/1984 | Quinn .......................... | 414/755 |
| 5,002,010 A | | 3/1991 | Weinberg | |
| 5,120,634 A | * | 6/1992 | Kobayashi ................... | 430/330 |
| 5,359,148 A | * | 10/1994 | Okase et al. ................ | 118/724 |
| 5,551,165 A | | 9/1996 | Turner et al. | |
| 5,811,211 A | * | 9/1998 | Tanaka et al. ................ | 430/30 |
| 5,837,094 A | * | 11/1998 | Tsukazaki et al. ...... | 156/345.25 |
| 5,839,455 A | | 11/1998 | Turner et al. | |
| 5,944,894 A | | 8/1999 | Kitano et al. | |
| 5,999,886 A | | 12/1999 | Martin et al. | |
| 6,002,108 A | * | 12/1999 | Yoshioka ..................... | 219/388 |
| 6,106,167 A | * | 8/2000 | Gao et al. ................... | 396/579 |
| 6,113,694 A | * | 9/2000 | Davis .......................... | 118/663 |
| 6,263,587 B1 | * | 7/2001 | Raaijmakers et al. ......... | 34/404 |
| 6,431,115 B2 | * | 8/2002 | Komino et al. ....... | 118/723 VE |
| 6,620,251 B2 | * | 9/2003 | Kitano ........................ | 118/725 |
| 6,633,022 B2 | * | 10/2003 | Kitano et al. .............. | 219/390 |

FOREIGN PATENT DOCUMENTS

| | | | | |
|---|---|---|---|---|
| JP | 09026176 A | * | 1/1997 | ............. F24F/7/06 |
| JP | 09260275 A | * | 10/1997 | ......... H01L/21/027 |
| JP | 10284405 A | * | 10/1998 | ......... H01L/21/027 |
| JP | 11-204396 | | 7/1999 | |

* cited by examiner

*Primary Examiner*—Parviz Hassanzadeh
*Assistant Examiner*—Karla Moore
(74) *Attorney, Agent, or Firm*—Oblon, Spivak, McClelland, Maier & Neustadt, P.C.

(57) ABSTRACT

A system for performing a coating and developing treatment for a substrate. The system includes a processing zone having a coating treatment unit, a developing treatment unit, and a heat treatment unit. An interface section carries the substrate between the processing zone and an aligner not included in the system for performing an exposure processing for the substrate. A unit measures the density of impurities at least inside the processing zone or the interface section, and a reduced-pressure impurity removing unit has a chamber which can be closed airtightly for reducing the pressure inside the chamber to a predetermined pressure before the substrate undergoes the exposure processing to remove the impurities adhering to the coating layer on the substrate inside the chamber for a predetermined time. A reduced-pressure control unit controls at least the predetermined pressure or predetermined time based on the value measured by the density measuring unit.

9 Claims, 10 Drawing Sheets

FIG.7

| DENSITY OF IMPURITIES (%) | 0~19 | 20~39 | 40~59 | 60~79 | 80~100 |
|---|---|---|---|---|---|
| SET PRESSURE (kPa) | 2.4 | 2.3 | 2.2 | 2.1 | 2.0 |
| PRESSURE-REDUCING TIME (sec) | 110 | 120 | 130 | 140 | 150 |

FIG.8

| DENSITY OF IMPURITIES (%) | 0~19 | 20~39 | 40~59 | 60~79 | 80~100 |
|---|---|---|---|---|---|
| PRESSURE-REDUCING SPEED (kPa/sec) | 13 | 10 | 7 | 4 | 1 |

METHOD AND SYSTEM FOR COATING AND DEVELOPING

BACKGROUND OF THE INVENTION

1. Field of the Invention

The present invention relates to a coating and developing treatment method and a coating and developing treatment system for a substrate.

2. Description of the Related Art

In a photolithography process in semiconductor device fabrication processes, for example, a resist coating treatment for forming a resist film on the surface of a wafer, a developing treatment for performing developing treatment for the wafer after being exposed in a pattern, and a heat treatment, a cooling treatment, and so on performed before the coating treatment, before and after an exposure processing, and after the developing treatment, are performed. These treatments are performed in respective processing units disposed independently for respective treatments, and these processing units are integrated as a coating and developing treatment system so that it can perform a series of the above treatments subsequently. Incidentally, the exposure processing is performed in an aligner usually disposed adjacent to the coating and developing treatment system.

Conventionally, the coating and developing treatment system has a load/unload section for carrying a substrate into/out of the coating and developing treatment system, a coating treatment unit, a developing treatment unit, a heat treatment unit, and so on, and is composed of a processing zone for performing most of the wafer treatments mentioned above and an interface section for carrying the wafer between the processing zone and the aligner disposed outside the system.

When the wafer treatments are performed in the coating and developing treatment system, air which is cleaned by an air purifier and so on is supplied as a down flow into the coating and developing treatment system in order to prevent impurities such as fine particles from adhering to the wafers, while an atmosphere inside the coating and developing treatment system is exhausted, so that the wafer can undergo the treatments in a clean state.

In recent years, however, an exposure technology utilizing light with a shorter wavelength (157 nm, for example) is being developed in order to form a finer, more precise circuit pattern. Consequently, when the wave with a short wavelength is utilized, it is worried that impurities at a molecular level, for example, oxygen, ozone, vapor, and so on, which do not cause any problem conventionally, give an adverse effect on the exposure processing so that a precise circuit pattern may not be formed.

Herein, a method of carrying the substrate into a chamber where airtightness can be maintained before the exposure processing for the wafer, and thereafter removing impurities which adhere on the surface of the wafer by reducing the pressure inside the chamber to a predetermined pressure, are considered. In this case, however, when the impurities are to be removed inside the chamber in which a predetermined condition is set, irrespective of the amount of the impurities adhering to the wafer, it should be taken into consideration that an excessive removing process or an insufficient removing process may be carried out.

SUMMARY OF THE INVENTION

The present invention is made in consideration of the above-described aspects, and its object is to remove impurities at a molecule level such as moisture adhering to a substrate such as a wafer and carry out the removing process of the impurities under a preferable minimum requirement condition in a coating and developing treatment system.

A coating and developing treatment method according to the present invention comprises the steps of: supplying a coating solution to a substrate to form a coating layer on the substrate; performing a developing treatment for the substrate in the processing zone after it undergoes an exposure processing by an aligner not included in the system; and carrying the substrate into the chamber after the step of forming the coating layer and before the exposure processing and thereafter reducing the pressure inside the airtightly closed chamber to a predetermined pressure to remove impurities adhering to the substrate inside the chamber from the substrate for a predetermined time, wherein the predetermined pressure and the predetermined time are adjusted based on the density of the impurities measured inside the processing zone.

The impurities mentioned above include not only fine particles such as dust and dirt but also impurities at a molecule level such as moisture, vapor, oxygen, ozone, and organic substance.

From another viewpoint of the present invention, the predetermined pressure and the predetermined time are adjusted based on the density of the impurities measured inside a clean room where the coating and developing treatment system is placed.

From still another viewpoint of the present invention, pressure-reducing speed in the step of reducing the pressure inside the chamber to the predetermined pressure is adjusted based on the density of the impurities measured inside the processing zone and inside a clean room where the coating and developing treatment system is placed.

A coating and developing treatment system according to the present invention comprises: a processing zone having a coating treatment unit for forming a coating layer on a substrate, a developing treatment unit for performing a developing treatment for the substrate, and a heat treatment unit for performing a heat treatment for the substrate; an interface section for carrying the substrate between the processing zone and an aligner not included in the system for performing an exposure processing for the substrate; a density measuring unit for measuring the density of impurities at least inside the processing zone or the interface section; a reduced-pressure impurity removing unit having a chamber which can be closed airtightly for reducing the pressure inside the chamber to a predetermined pressure before the substrate undergoes the exposure processing to remove the impurities adhering to the coating layer on the substrate inside the chamber for a predetermined time; and a reduced-pressure control unit for controlling at least the predetermined pressure or the predetermined time based on the value measured by the density measuring unit.

From another aspect of the present invention, the density measuring unit measures the density of impurities measured inside a clean room in which the coating and developing treatment system is placed.

From still another aspect of the present invention, the reduced-pressure control unit controls pressure-reducing speed of the reduced-pressure impurity removing unit at the time of reducing the pressure inside the chamber to the predetermined pressure.

According to the present invention, since the impurities adhering to the substrate are removed during the period between the step of forming the coating layer and the step of exposure processing, there are no impurities adhering to the substrate when it undergoes the exposure processing. Therefore, the exposure processing using light with a short wavelength can be performed in a preferable condition. Moreover, the predetermined reduced pressure, the predetermined time, and pressure-reducing speed for the chamber where the aforesaid removing step is carried out are adjusted based on the density of the impurities inside the processing zone and the clean room. Thereby, when it is predicted, for example, that not much amount of impurities adheres to the substrate, or when the density of the impurities inside the processing zone is low, the predetermined pressure is decreased, the pressure-reducing time is shortened, or the pressure-reducing speed is lowered so that excessive removing can be prevented. When it is predicted that much amount of impurities adheres to the substrate, or the density of the impurities inside the processing zone is high, the predetermined pressure is increased, the pressure-reducing time is lengthened, or the pressure-reducing speed is increased so that the removing process is sufficiently carried out.

Accordingly, the impurities can be removed under a preferable minimum requirement condition. Furthermore, by reducing the pressure inside the chamber, a solvent in the coating solution can be vaporized at the same time so that this kind of process, which is conventionally performed by a heat treatment, can be carried out simultaneously.

Incidentally, the removing of the impurities is performed by reducing the pressure inside the chamber below the predetermined pressure, for example, below the saturated vapor pressure of water at a predetermined temperature, and vaporizing, for example, moisture adhering to the substrate.

BRIEF DESCRIPTION OF THE DRAWINGS

FIG. 7 is a table showing set pressure and pressure-reducing time for respective density ranges of impurities which are stored in a controller of the reduced-pressure impurity removing unit;

FIG. 8 is a table showing the values of pressure-reducing speed set for respective density ranges of impurities which are stored in the controller for the reduced-pressure impurity removing unit according to a second embodiment;

DETAILED DESCRIPTION OF THE PREFERRED EMBODIMENTS

Figure 1:
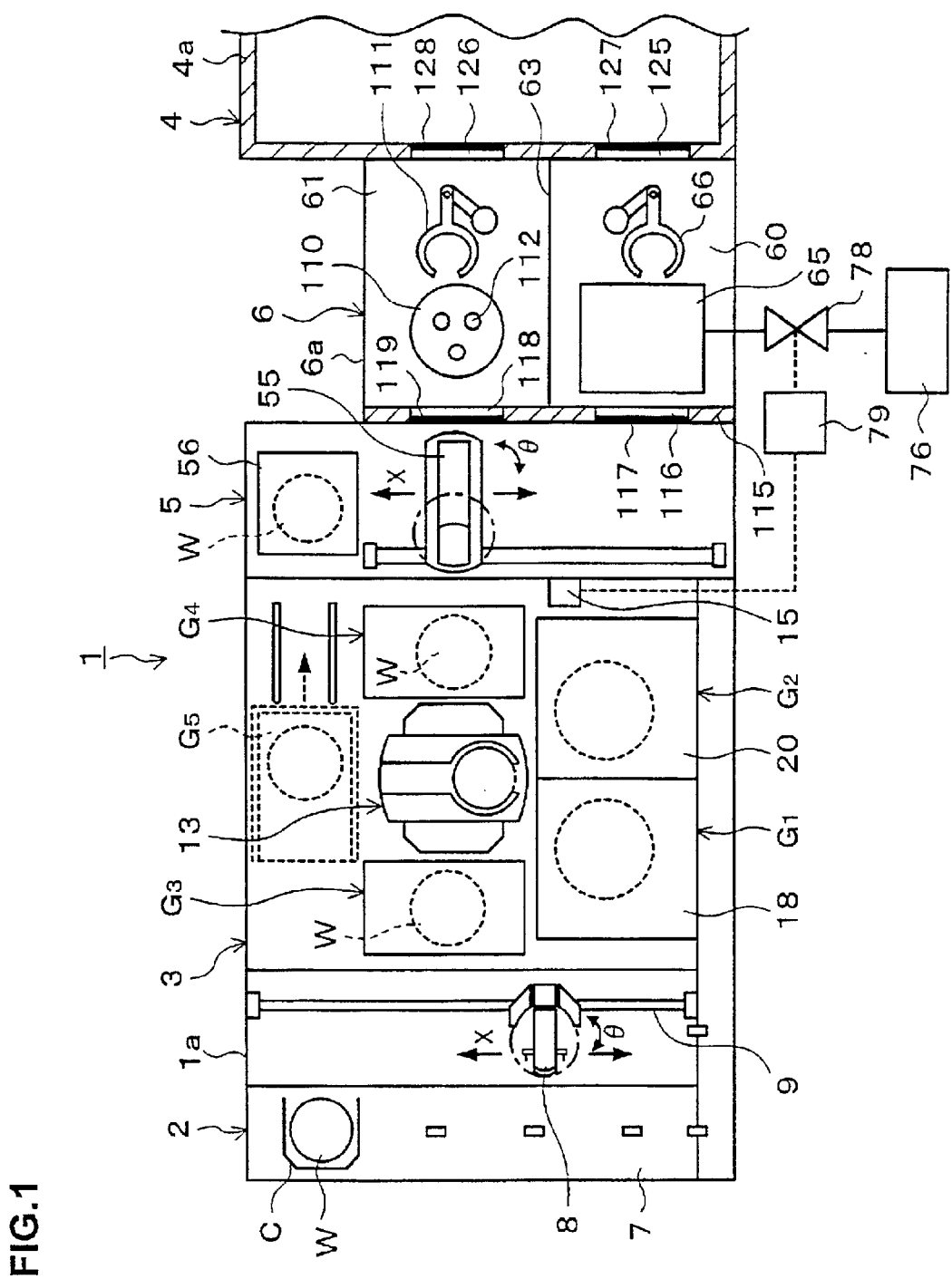
FIG. 1 is an explanatory plan view of a coating and developing treatment system according to the present embodiment.
Figure 2:
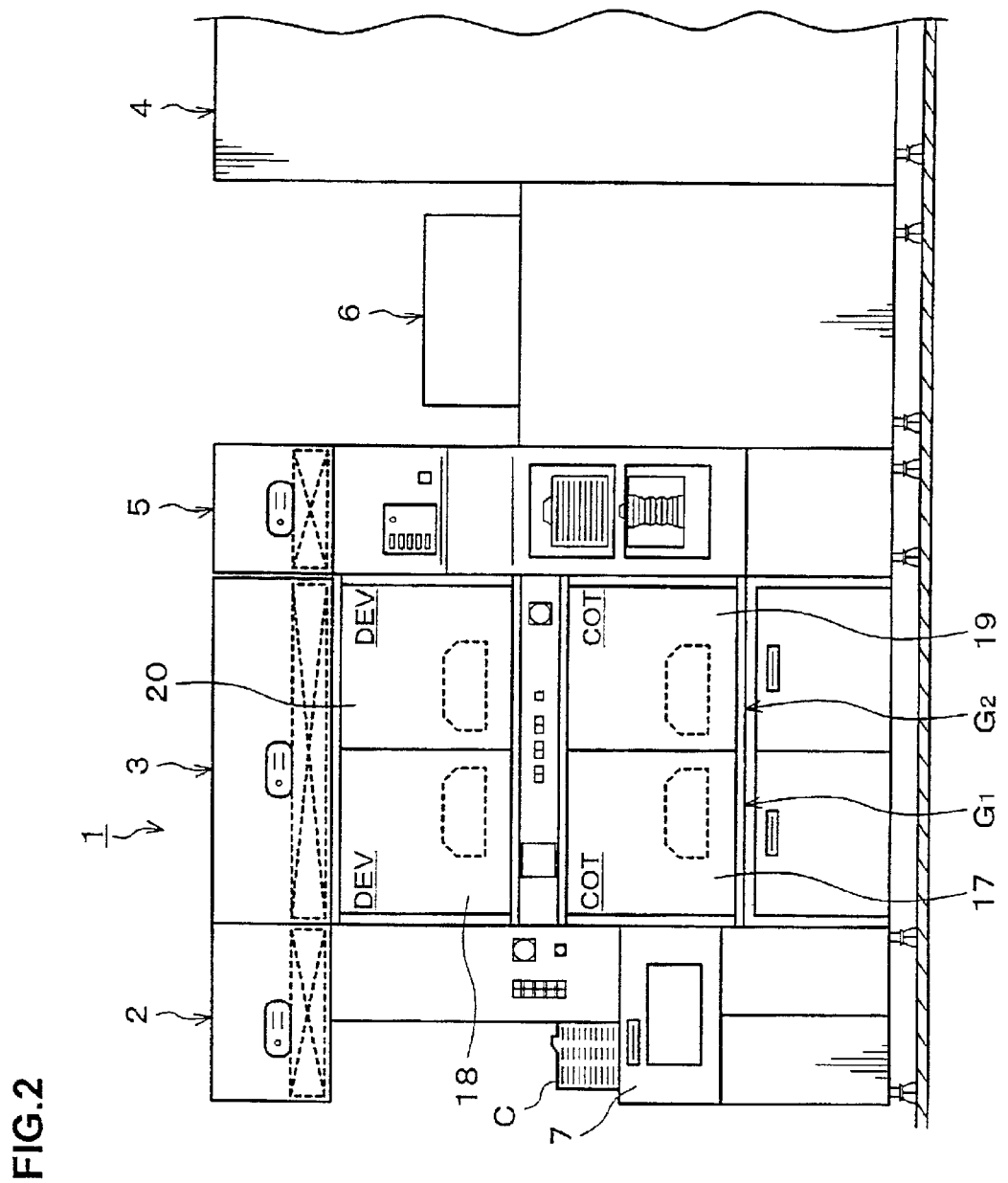
FIG. 2 is a front view of the coating and developing treatment system in FIG. 1.
Figure 3:
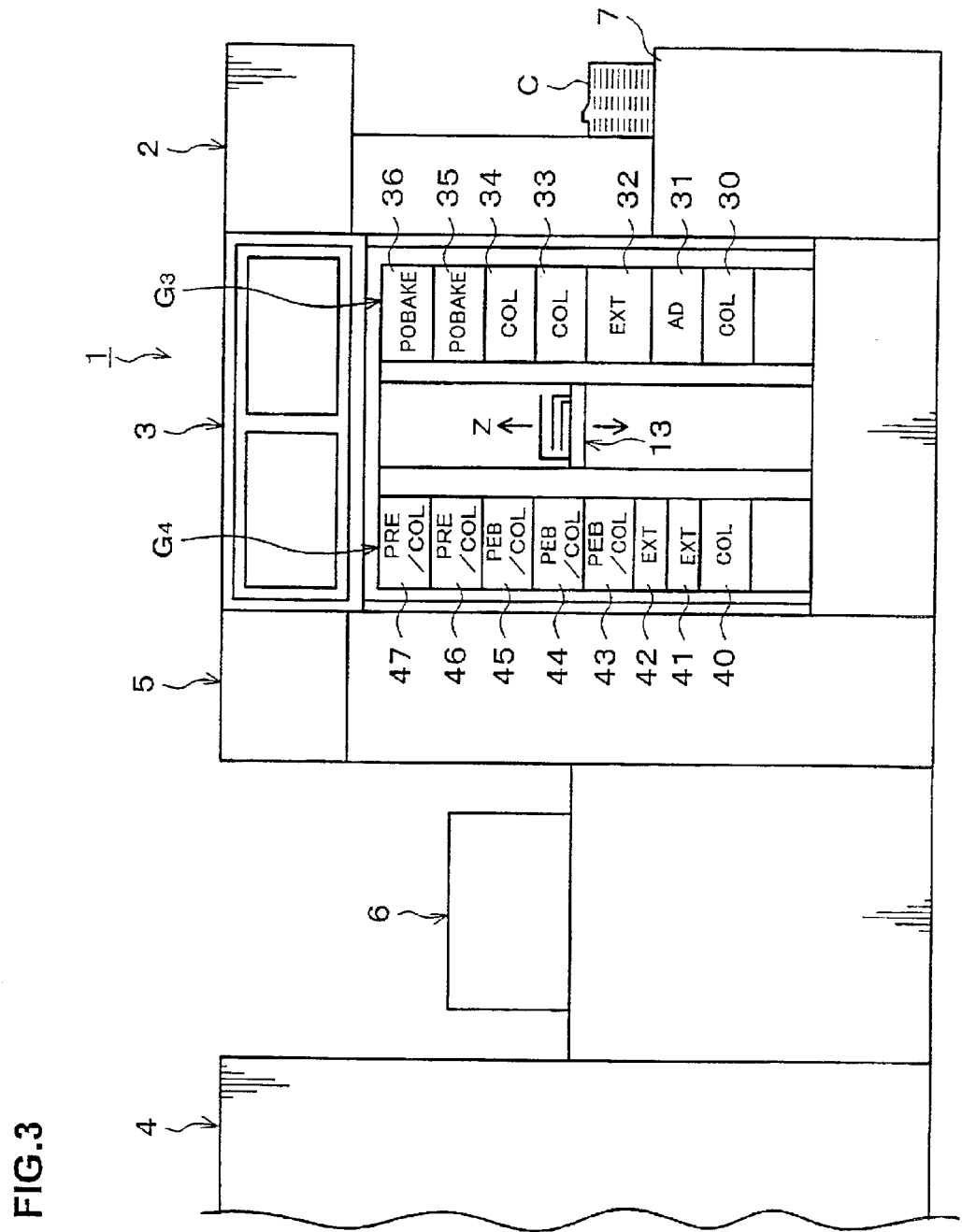
FIG. 3 is a rear view of the coating and developing treatment system in FIG. 1.

Preferred embodiments of the present invention will be described below. FIG. 1 is a plan view of a coating and developing treatment system 1 according to the present embodiment, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for carrying, for example, 25 wafers W as a unit per cassette from/to the outside to/from the coating and developing treatment system 1 and for carrying the wafers W to/from a cassette C, a processing station 3 serving as a processing zone with various kinds of processing units disposed in multi-tiers, for performing predetermined processing one by one in coating and developing processes, an interface section 5 provided adjacent to the processing station 3, for serving as a part of a path where the wafers W are carried from/to an aligner 4 disposed outside the coating and developing treatment system 1 to/from the processing station 3, and a delivery section 6 disposed between the interface section 5 and the aligner 4 for delivering the wafers W to/from the interface section 5 to/from the aligner 4 are integrally connected in a casing 1a.

In the cassette station 2, a plurality of the cassettes C are mountable at predetermined positions on a cassette mounting table 7 in a line in an X-direction (a perpendicular direction in FIG. 1). Furthermore, a wafer carrier 8, which is transferable in the direction of the alignment of the cassettes (the X-direction) and in the direction of the alignment of the wafers W housed in the cassette C (a Z-direction; a perpendicular direction), is provided to be movable along a carrier path 9 and is selectively accessible to the respective cassettes C.

The wafer carrier 8 has an alignment function for aligning the wafers W. The wafer carrier 8 is structured so as to be also accessible to an extension unit 32 and an adhesion unit 31 included in a third processing unit group G3 on the processing station 3 side as will be described later.

In the processing station 3, a main carrier unit 13 is provided in a center part thereof, and various kinds of processing units are multi-tiered on the periphery of the main carrier unit 13 to constitute processing unit groups. In the coating and developing treatment system 1, there are four processing unit groups G1, G2, G3 and G4, and a first and a second processing unit groups G1 and G2 are disposed on the front side of the coating and developing treatment system 1, the third processing unit group G3 is disposed adjacent to the cassette station 2, and a fourth processing unit group G4 is disposed adjacent to the interface section 5. Furthermore, as an option, a fifth processing unit group G5 depicted by broken lines can be additionally disposed on the rear side. The main carrier unit 13 can carry the wafers W to/from various kinds of processing units described later disposed in these processing unit groups G1, G2, G3, G4 and G5. In addition, inside the processing station 3, a density measuring unit 15, for example, API-MASS and so on, for measuring the density of impurities such as moisture, vapor, oxygen, ozone, and organic substance, is disposed so that the density of the impurities inside the processing station 3 can be measured on occasion and the measured value can be transmitted to a controller 79 described later.

In the first processing unit group G1, as shown, for example, in FIG. 2, a resist coating treatment unit 17 for applying a resist solution on the wafers W and a developing treatment unit 18 for performing a developing treatment on the wafers W after an exposure processing are two-tiered in the order from the bottom. Similarly, as for the second processing unit group G2, a resist coating treatment unit 19 and a developing treatment unit 20 are two-tiered in the order from the bottom.

In the third processing unit group G3, as shown, for example, in FIG. 3, a cooling unit 30 for cooling the wafers W, the adhesion unit 31 for increasing the fixability between the resist solution and the wafers W, the extension unit 32 for temporarily keeping the wafers W on standby, cooling units 33 and 34 for cooling the wafers W after the exposure processing, post-baking units 35 and 36 for performing a heat treatment for the wafers after the developing treatment and so on are, for example, seven-tiered in the order from the bottom.

In the fourth processing unit group G4, for example, a cooling unit 40, extension units 41 and 42 for mounting the wafers thereon after the exposure processing and temporarily keeping them on standby, heat and cooling treatment units 43, 44, and 45 (PEB/COL in FIG. 3) for heating the wafers after the exposure processing and cooling them to a predetermined temperature thereafter, heat and cooling treatment units 46 and 47 (PRE/COL in FIG. 3) for heating a solvent in the resist solution to evaporate it and cooling it to a predetermined temperature thereafter, and so on are, for example, eight-tiered in the order from the bottom.

Figure 4:
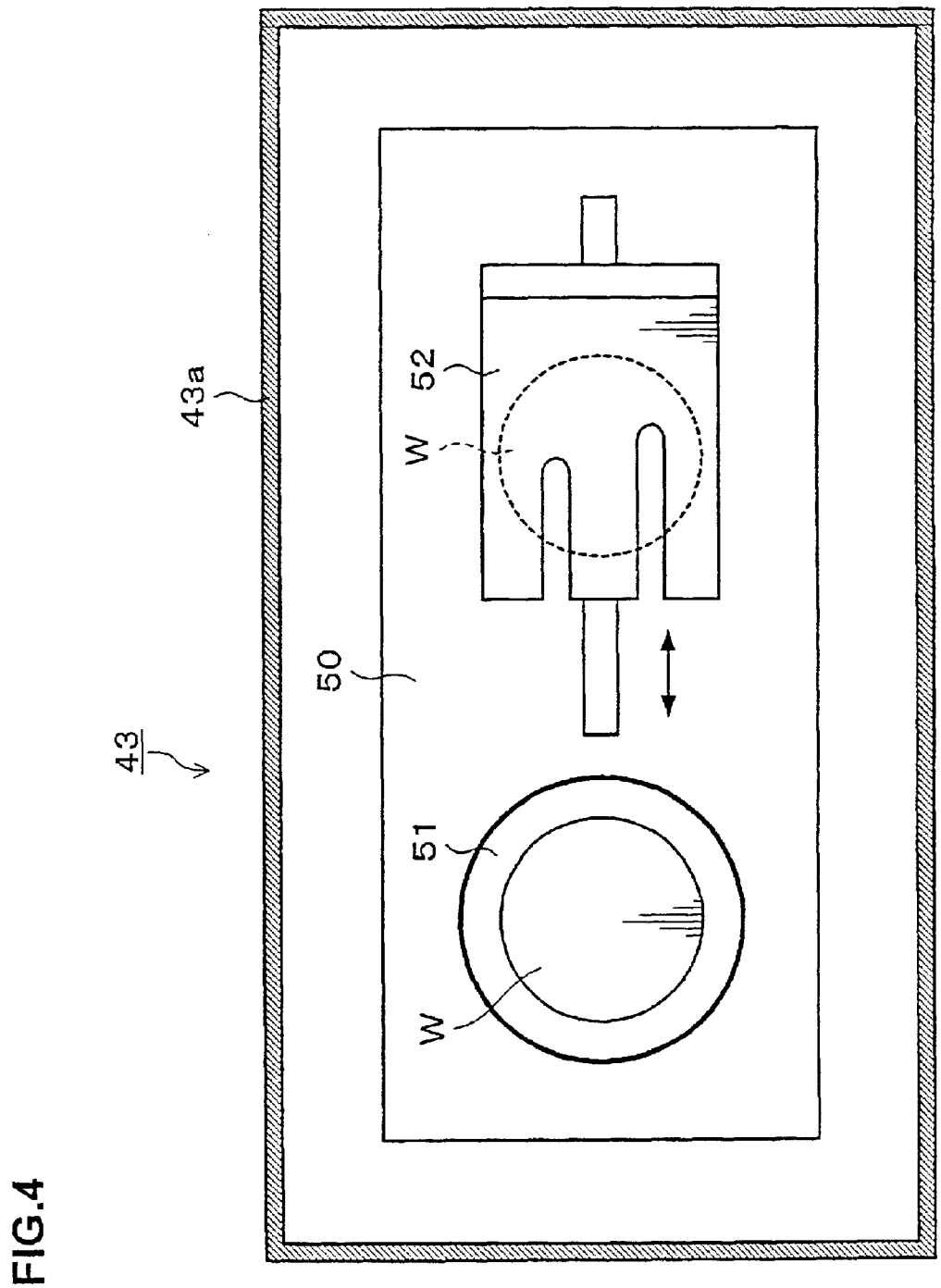
FIG. 4 is a schematic view of a horizontal cross section of a heat and cooling treatment unit inside the coating and developing treatment system in FIG. 1.

The heat and cooling treatment unit 43, as shown in FIG. 4, has on a base 50 inside its casing 43a a disc-shaped heating plate 51 for heating the substrate and a cooling plate 52 for cooling the wafers W immediately after it moves onto the heating plate 51 to receive the wafers W from the heating plate 51. Therefore, heat and cooling treatments for the wafers W can be performed in sequence in the same unit to constantly keep heat history given to the wafers W by the heat treatment in a fixed state. Incidentally, the other heat and cooling treatment units 44 to 47 have the same structure.

In the center part of the interface section 5, as shown in FIG. 1, a wafer carrier 55 is provided. The wafer carrier 55 is structured so as to be movable in the direction X (the perpendicular direction in FIG. 1) and the direction Z (the perpendicular direction), and to be rotatable in a direction θ (a rotational direction about an axis Z), so that it can get access and carry the wafers W to the extension units 41 and 42 included in the fourth processing unit group G4, a peripheral aligner 56, and the delivery section 6.

The delivery section 6 is surrounded by a tunnel-shaped casing 6a having a rectangular cross section to prevent another atmosphere from flowing into the delivery section 6 easily. Furthermore, the delivery section 6 has a first path 60 for allowing the wafers W to pass therethrough when they are carried from the interface section 5 to the aligner 4, and a second path 61 for allowing the wafers W to pass therethrough when they are carried from the aligner 4 to the interface section 5. Between the first path 60 and the second path 61, a partition plate 63 is provided to prevent the atmosphere of the first path 60 and the second path 61 from interfering with each other.

Inside the first path 60, a reduced-pressure impurity removing unit 65 for vaporizing and removing the impurities such as moisture adhering to the resist film on the wafers W inside a reduced-pressure chamber S, and a wafer transfer mechanism 66 for carrying the wafers W to the reduced-pressure impurity removing unit 65 and the aligner 4 are provided.

Figure 5:
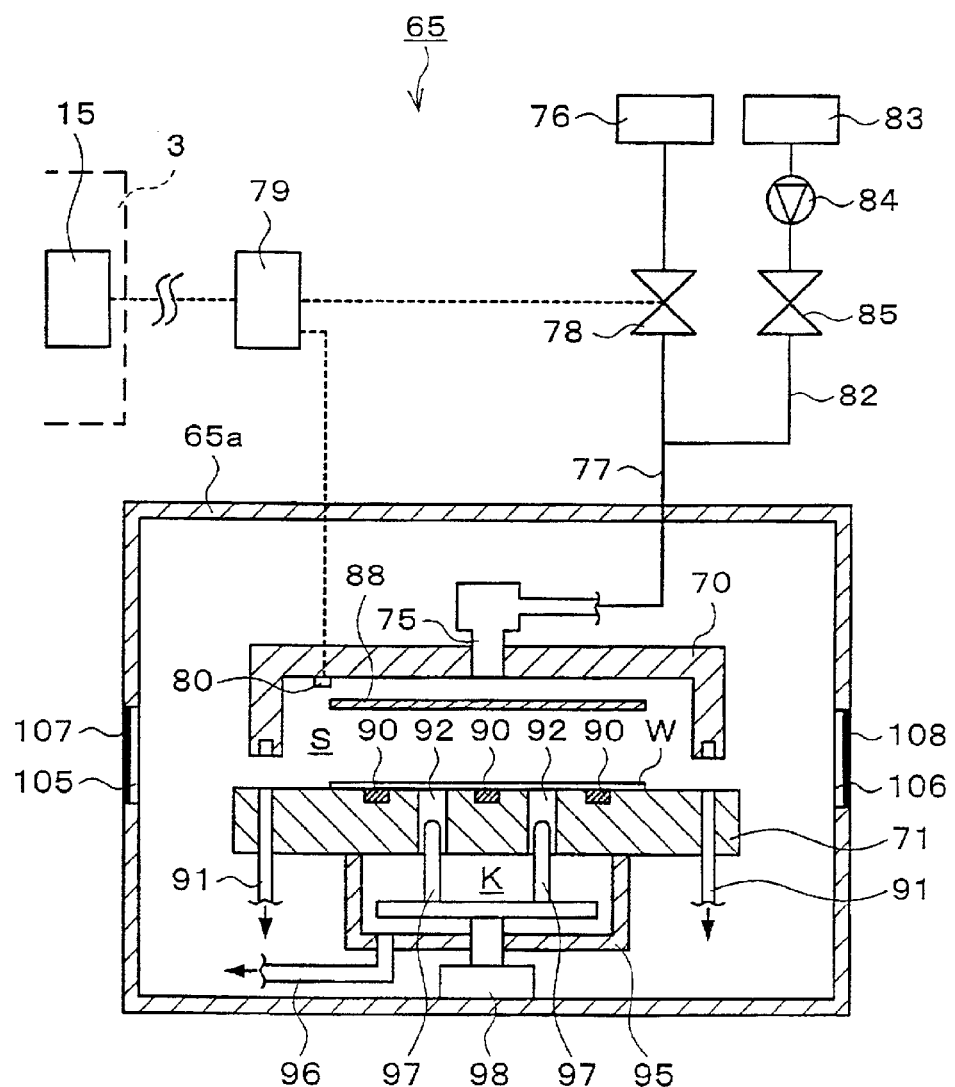
FIG. 5 is an explanatory view of a vertical cross section showing the structure of a reduced-pressure impurity removing unit inside a delivery section.

Here, the structure of the reduced-pressure impurity removing unit 65 is explained in detail. The reduced-pressure impurity removing unit 65, as shown in FIG. 5, has inside its casing 65a a lid body 70 formed in a substantially cylindrical shape with its bottom side open and movable up and down, and a mounting table 71 disposed under the lid body 70 to form a reduced-pressure chamber S serving as a chamber integrally with the lid body 70.

In the center portion of the upper surface of the lid body 70, an exhaust port 75 for exhausting an atmosphere inside the reduced-pressure chamber S is provided, and the exhaust port 75 is communicated with a suction unit 76 for sucking the atmosphere and decreasing the pressure inside the reduced-pressure chamber S through a first pipe 77. Inside the first pipe 77, a first valve 78 serving as a reduced-pressure controlling unit is provided for controlling the pressure and the pressure-reducing time for the reduced-pressure chamber S, so that a predetermined set pressure, which the pressure inside the reduced-pressure chamber S finally reaches, and the pressure-reducing time can be controlled by changing the opening and closing of the first valve 78 by a motor not shown, air pressure, and so on.

Furthermore, the first valve 78 itself is controlled by the controller 79 serving as a controller. When pressure inside the reduced-pressure chamber S is reduced, the controller 79, which can receive data from a pressure sensor 80 disposed inside the lid body 70, controls the first valve 78 based on the data to reduce the set pressure inside the reduced-pressure chamber S.

The controller 79 can receive the measured value from a density measuring unit 15 inside the processing station 3 described above on occasion. The controller 79 has a function for storing the density of the impurities inside the processing station 3 and the set pressure and the pressure-reducing time for the reduced-pressure chamber S appropriate for respective density ranges, so that it can control the first valve 78 based on the measured value of the impurity density sent from the above-mentioned density measuring unit 15 to change the set pressure and the pressure-reducing time for the reduced-pressure chamber S to equal to the stored appropriate values.

In the first pipe 77, a second pipe 82 is disposed to branch off therefrom, and the second pipe 82 is communicated with a buffer tank 83 storing inert gas, for example, nitrogen gas. In the second pipe 82, a pump 84 for sending the inert gas by pressure into the reduced-pressure chamber S and a second valve 85 for adjusting its flow rate are provided to supply the inert gas at a predetermined flow rate to the reduced-pressure chamber S whose pressure is reduced and restore the pressure of the reduced-pressure chamber S. In the upper inward part of the lid body 70, a current plate 88 is provided and thereby the atmosphere inside the reduced-pressure chamber S is uniformly exhausted.

The mounting table 71 is formed to be a disc shape with some thickness and the wafers W can be mounted thereon. On the mounting table 71, a temperature controller 90 not shown, for example, a Peltier element and so on, is provided to control the mounting table 71 at a predetermined temperature, so that the temperature of the wafers W mounted on the mounting table 71 can be kept uniform over the surfaces of the wafers W. Opposite to lower end portions of the lid body 70 in the mounting table 71, a plurality of suction ports 91 are disposed, so that when the lower end portions of the lid body 70 and the mounting table 71 contact each other, fixability between the lid body 70 and the mounting table 71 is maintained due to suction force from the suction ports 91, and when the pressure inside the reduced-pressure chamber S is reduced, air current turbulence formed inside the reduced-pressure chamber S can be prevented. Near the center part of the mounting table 71, through holes 92 passing through the mounting table 71 in a vertical direction are provided.

Under the mounting table 71, a container 95 having a substantially cylindrical shape, which forms a negative pressure chamber K integrally with a bottom surface of the mounting table 71, is disposed. The negative pressure chamber K is communicated with the reduced-pressure chamber S via the through holes 92. On a bottom surface of the container 95, a ventilation pipe 96 is provided, so that the atmosphere inside the negative pressure chamber K is sucked by a pressure-reducing unit not shown through the ventilation pipe 96 and the wafers W can be attached by suction onto the mounting table 71 via the through holes 92. Inside the container 95, hoisting and lowering pins 97 for hoisting and lowering the wafers W are provided, and the hoisting and lowering pins 97 can freely ascend and descend inside the through holes 92 by a hoisting and lowering drive mechanism.

On the interface section 5 side and the aligner 4 side in the casing 65a, transfer ports 105 and 106 for transferring the wafers W thereto/therefrom are provided respectively, and in the respective transfer ports 105 and 106, shutters 107 and 108 are provided.

In the second path 61, as shown in FIG. 1, a rest portion 110 for temporarily resting the wafers W thereon after the exposure processing when they are carried to the interface section 5, and a wafer transfer mechanism 111 for transferring the wafers W inside the aligner 4 to the rest portion 110 are provided.

The rest portion 110 is formed to be a disc shape, and around the center thereof, a hoisting and lowering mechanism 112 for hoisting and lowering the wafers W rested thereon is provided. By the hoisting and lowering mechanism 112, the wafers W can be delivered to/from the rest portion 110 to/from the wafer transfer mechanism 111 and the wafer carrier 55.

Between the delivery section 6 and the interface section 5, a partition plate 115 for insulating the atmosphere inside the delivery section 6 from the atmosphere inside the interface section 5 is provided. In the position opposite to the reduced-pressure impurity removing unit 65 in the partition plate 115, a passage port 116 is provided so that the wafers W can be carried therethrough from the interface section 5 to the reduced-pressure impurity removing unit 65 by the wafer carrier 55. In the passage port 116, a shutter 117 for allowing the passage port 116 to open and close freely is provided, and the shutter 117 is opened only when the wafers W pass through the passage port 116, and is closed in other cases.

In the position opposite to the rest portion 110 in the partition plate 115, a passage port 118 is provided so that the wafers W can be carried therethrough from the rest portion 110 into the interface section 5 by the wafer carrier 55. Furthermore, in the passage port 118, a shutter 119 for allowing the passage port 118 to open and close freely is provided, and the shutter 119 is opened only when the wafers W pass through the passage port 118.

Figure 6:
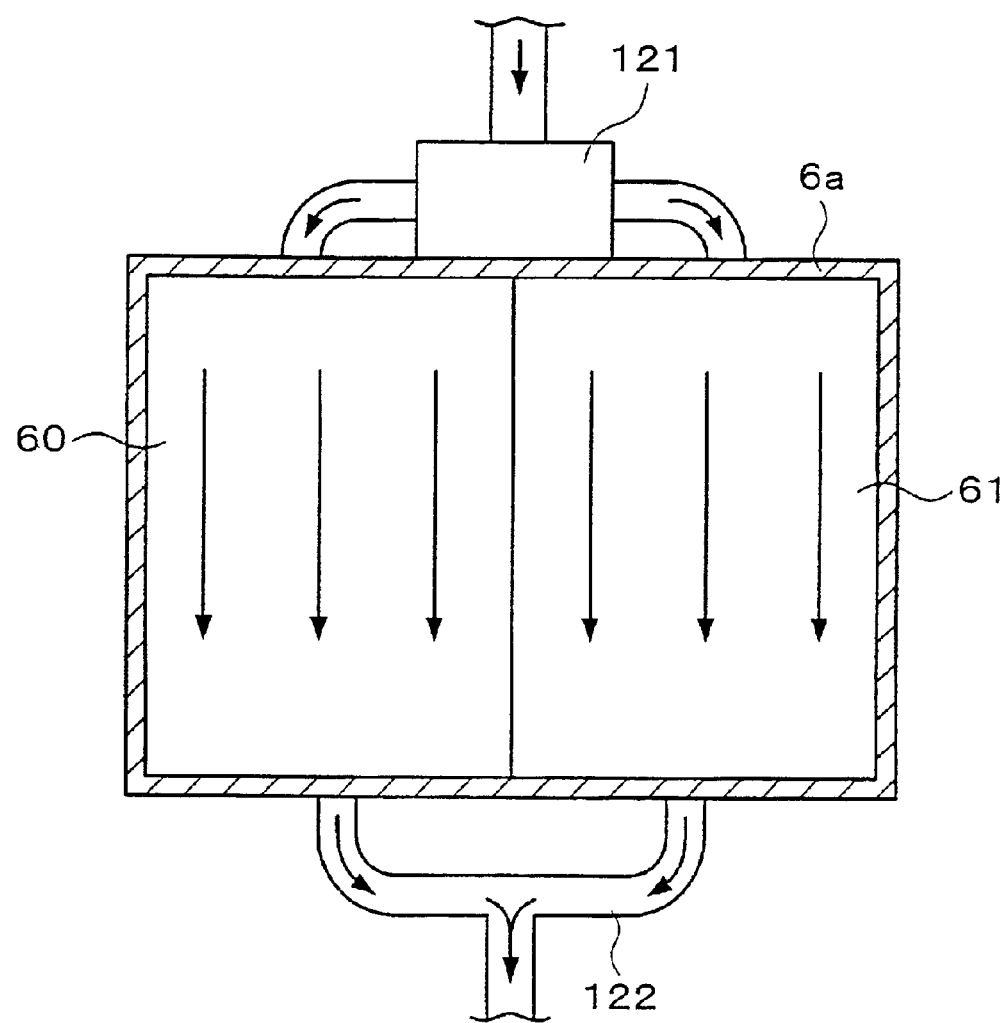
FIG. 6 is an explanatory view of a vertical cross section viewed from an aligner, showing the flow state of inert gas inside the delivery section of the coating and developing treatment system in FIG. 1.

On the upper side of the delivery section 6 as structured above, as shown in FIG. 6, a gas supply unit 121 for supplying inert gas to the first path 60 and the second path 61 and for purging impurities, and an exhaust duct 122 for exhausting the atmosphere inside the first path 60 and the second path 61 are provided to constantly keep the atmosphere inside the first path 60 and the second path 61 in a purified state. In addition, the pressure inside the delivery section 6 can be controlled by controlling the supply amount of the inert gas.

The aligner 4 for performing the exposure processing for the wafers W is disposed adjacent to the delivery section 6 as shown in FIG. 6. The aligner 4 is tightly closed with a casing 4a of the aligner 4 to strictly control the atmosphere inside the aligner 4. On the delivery section 6 side in the casing 4a, a passage port 125 for carrying thereto the wafers W from the first path 60 and a passage port 126 for carrying therefrom the wafers W to the second path 61 are provided, and to the respective passage ports 125 and 126, shutters 127 and 128 for allowing the respective passage ports 125 and 126 to open and close freely are provided.

Next, the processes of photolithography performed in the coating and developing treatment system 1 as structured above is explained.

First, before the treatments for the wafers W are started, the density of the impurities inside the processing station 3 obtained beforehand by experiments and so on, and the set pressure and the pressure-reducing time for the reduced-pressure chamber S necessary for removing the impurities adhering to the wafers W when the wafers W undergo the treatments in that density are stored in the controller 79 for respective predetermined density ranges, for example, for every 20 percent density ranges as shown in FIG. 7.

Then, when the coating and developing treatment system 1 is operated, the density measuring unit 15 starts its measuring operation, the measured value is sent to the controller 79, and the set pressure and the pressure-reducing time for the reduced-pressure chamber S corresponding to the measured value are determined. When the density of the impurities is, for example, 30 percent, they are set at 2.3 kPa and 120 sec respectively. Thereafter, the density of the impurities is measured all the time, the measured values are sent to the controller 79 consecutively, and the set pressure and the pressure-reducing time for the reduced-pressure chamber S are consecutively changed based on the measured values.

When the inert gas is then supplied into the delivery section 6, the atmosphere inside the delivery section 6 is replaced by a purified one, and thereafter such a state is maintained. At this time, it is preferred that the pressure inside the delivery section 6 is set lower than the pressure inside the aligner 4 to prevent the atmosphere inside the delivery section 6 from flowing into the aligner 4 which is strictly purified.

Then, when the treatments for the wafers W are started, the wafer carrier 8 first takes one unprocessed wafer W out of the cassette C in the cassette station 2 and carries it to the adhesion unit 31 in the processing station 3.

Next, the wafer W coated in the adhesion unit 31 with an adhesion promoter such as HMDS which enhances adhesion to the resist solution is carried to the cooling unit 30 by the main carrier unit 13 and cooled to a predetermined temperature. Thereafter, the wafer W is carried to the resist coating treatment unit 17 or 19 to undergo the resist coating treatment. Then, the wafer W on which the resist film is formed is carried to the heat and cooling treatment unit 46 or 47 (PRE/COL in FIG. 3) to undergo the heat and cooling treatment. At this time, the heat treatment and the cooling treatment are not performed in subsequence in respective units disposed independently for the respective treatments, but the heat and cooling treatment is performed inside a single unit such as the heat and cooling treatment units 46 and 47, so that the time length from the heat treatment to the cooling treatment for the wafer W can be kept constantly the same, which allows the heat history given to the wafers by the heat treatment to be the same among the wafers W.

Moreover, according to the present embodiment, all of the heat and cooling treatments performed in the steps from the resist coating treatment to the developing treatment are performed in the heat and cooling treatment units 43 to 47, so that the time required for the steps from the resist coating treatment to the developing treatment is allowed to be the same among all the wafers W.

Thereafter, the wafer W is carried to the extension unit 41 and carried by the wafer carrier 55 from the extension unit 41 to the peripheral aligner 56 inside the interface section 5. Then, the wafer W which has undergone the exposure processing at its peripheral portion by the peripheral aligner 56 is again held by the wafer carrier 55, and carried from the passage port 116 to the reduced-pressure impurity removing unit 65 inside the first path 60 of the delivery section 6. At this time, the shutter 117 is opened, and when the wafer W is carried into the reduced-pressure impurity removing unit 65, the shutter 117 is closed again.

Here, the steps of the impurity removing process performed in the reduced-pressure unit 65 are explained in detail. First, the shutter 107 on the interface section 5 side of the casing 65a as shown in FIG. 5 is opened and the wafer W is carried into the casing 65a by the aforesaid wafer carrier 55. The wafer W is then delivered to the hoisting and lowering pin 97 and thereafter, by the descent of the hoisting and lowering pin 97, mounted on the mounting table 71 which is maintained at the set temperature of, for example, 23° C. Then, the wafer W is held by suction on the mounting table 71 due to the suction from the ventilation pipe 96.

Thereafter, the lid body 70 lowers, and the end portions of the lid body 70 contact the mounting table 71 to form the reduced-pressure chamber S. At this time, suction from the suction ports 91 is started and the suction force causes the lid body 70 to contact the mounting table 71 closely.

Next, the suction unit 76 starts to operate, the atmosphere inside the reduced-pressure chamber S starts to be exhausted through the first pipe 77 from the exhaust port 75, and the pressure of the reduced-pressure chamber S begins to be reduced. The set pressure at this time is a set pressure determined based on the measured value of the impurity density inside the processing station 3 as described above, for example, 2.3 kPa, and based on this value the controller 79 controls the opening and closing of the valve to achieve it.

When the pressure inside the reduced-pressure chamber S continues to be reduced to reach the saturated vapor pressure of, for example, moisture, which is an impurity, the moisture adhering on the wafer W is vaporized to be detached from the wafer W and discharged from the exhaust port 75. Then, this state is maintained for some length of pressure-reducing time, for example, 120 sec, and this process is performed until the moisture on the wafer W is completely removed. In this way, the impurities such as moisture adhering on the wafers W are removed and thereby a desired reduced-pressure removing process is carried out.

Incidentally, when the impurity density of the processing station 3 is decreased, for example, from 30 percent to 15 percent, the set pressure and the pressure-reducing time are changed to 2.4 kPa and 110 sec respectively according to the data shown in FIG. 7, and the pressure-reduced removing process is performed under this condition. In this case, since the set pressure is increased and the pressure-reducing time is shortened compared with those in case of the 30 percent density to lower the impurity removing ability, the removing process corresponding to the impurity amount adhering to the wafer W, which is expected to be smaller than that in case of the 30 percent density, is performed. On the other hand, when the impurity density of the processing station 3 alters from 30 percent to 25 percent, the set pressure and the pressure-reducing time are not changed to maintain the set pressure and the pressure-reducing time as they are.

Then, when the aforesaid pressure-reducing time elapses, the first valve 78 is closed to stop reducing the pressure inside the reduced-pressure chamber S. Thereafter, when the pump 84 is put into operation and the second valve 85 is opened, inert gas inside the buffer tank 83 is supplied into the reduced-pressure chamber S through the second pipe 82 to restore the pressure inside the reduced-pressure chamber S.

Subsequently, after the suction from the suction port 91 is stopped, the lid body 70 rises to open the reduced-pressure chamber S. The attachment of the wafer W by suction to the mounting table 71 is then released and the hoisting and lowering pin 92 hoists the wafer W to deliver it to the wafer transfer mechanism 66 disposed on the aligner 4 side. Then, when the wafer W passes through the passage port 106 of the casing 65a and is carried out from the reduced-pressure impurity removing unit 65, the removing process of the impurities on the wafer W is completed.

Thereafter, the shutter 127 in the casing 4a of the aligner 4 is opened, and the wafer W is carried into the aligner 4 from the passage port 125 by the wafer transfer mechanism 66.

Subsequently, the wafer W is exposed in a predetermined pattern in the aligner 4. The wafer W after the exposure processing is then carried out of the aligner 4 into the second path 61 through the passage port 126 by the wafer transfer mechanism 111 inside the second path 61. At this time, the shutter 128 is opened, and when the wafer W passes through it, it is closed again.

The wafer W carried into the second path 61 is then moved onto the rest portion 110, delivered to the hoisting and lowering mechanism 112 of the rest portion 110, and thereafter, temporarily rested on the rest portion 110.

Thereafter, the wafer W, passing through the passage port 118 with the shutter 119 opened and through the interface section 5, are carried by the wafer carrier 55 into the extension unit 42 in the processing station 3. The wafer W is then carried to the heat and cooling treatment unit 43, 44, or 45 by the main carrier unit 13 and undergoes the heat treatment and the cooling treatment in sequence after the exposure processing.

Thereafter, the wafer W is carried to the developing treatment unit 18 or 20 to undergo the developing treatment. The wafer W after undergoing the developing treatment is then carried to the post-baking unit 35 or 36 to be heated, and thereafter carried to the cooling unit 33 or 34 to be cooled to a predetermined temperature. The wafer W is then carried to the extension unit 32 included in the third processing unit group G3 and from there returned to the cassette C in the cassette station 2 by the wafer carrier 55. Through the processes described above, a series of photolithography processes are completed.

According to the embodiment described above, the impurities such as moisture adhering on the wafer W can be removed by the reduced-pressure impurity removing unit 65 so that the exposure processing to be performed subsequently is performed in a preferable condition.

Furthermore, since the density of the impurities in the processing station 3 is measured and the set pressure and the pressure-reducing time for the reduced-pressure impurity removing unit 65 are adjusted based on the measured value, the minimum necessary processes for removing the impurities can be performed corresponding to the amount of the impurities adhering on the wafer W which has a close correlation with the density of the impurities.

In addition, as shown in FIG. 7, the density of the impurities is classified into predetermined density ranges and the set pressure and the pressure-reducing time are determined for each of the respective density ranges. Therefore, when the density is changed to an extent which does not influence the amount of the impurities adhering on the wafer W, the set pressure and so on are not altered, thereby eliminating unnecessary adjusting processes.

In the above-described embodiment, the set pressure and the pressure-reducing time for the reduced-pressure chamber S in the reduced-pressure impurity removing unit 65 are adjusted based on the impurity density inside the processing station 3, which serves as a processing zone, but pressure-reducing speed at the time of reducing pressure may be adjusted instead of the set pressure and the pressure-reducing time. An example of this is explained below as a second embodiment.

In this case, the pressure-reducing speed necessary for removing the impurities adhering on the wafer W, corresponding to the impurity density inside the processing station 3 as shown in FIG. 8 is stored beforehand for the respective impurity density ranges by the controller 79 of the coating and developing treatment system 1 which has the same structure as that in the above described embodiment. When the impurities adhering onto the wafer W are removed inside the reduced-pressure impurity removing unit 65, the opening and closing of the first valve 78 are set and adjusted in the similar manner to the first embodiment so that the pressure is reduced at a pressure-reducing speed determined based on the result measured by the density measuring unit 15 inside the processing station 3.

By adjusting the pressure-reducing speed according to the impurity density inside the processing station 3 as described above, the time required for reducing the pressure to the set pressure is adjusted. For example, when the impurity density is high and a large amount of impurities are adhering onto the wafer W, the pressure-reducing speed is decreased and thereby the pressure is allowed to reach the set pressure little by little so that an elapsing time for urging the impurities to be exhausted is allowed to last. Conversely, when the impurity density is low and a small amount of the impurities are adhering onto the wafer W, the pressure-reducing speed is increased, so that the pressure reaches the set pressure quickly.

In this way, the impurities on the wafer can be removed in a length of time according to the amount of the impurities adhering on the wafer W, which prevents an excessive process and insufficient process of removing the impurities. Incidentally, in this second embodiment, the set pressure and the pressure-reducing time may also be adjusted as described in the first embodiment.

In the above described embodiments, the density measuring unit 15 is provided in the processing station 3 to measure the impurity density inside the processing station 3, but the density measuring unit 15 may alternatively be provided in a clean room not included in the coating and developing treatment system 1 or the interface section 5 to measure the impurity density inside the clean room or the interface section 5. There is such an advantage in providing the density measuring unit 15 in the clean room in this way that the density measuring unit 15 can be mounted more easily because a larger space than the inside space of the processing station 3 is utilized. Providing the density measuring unit 15 in the interface section 5 has an advantage that it is positioned closer to the reduced-pressure impurity removing unit 65 than when it is provided in the processing station 3 and thereby the measured value of the impurity density is obtained which is most closely correlated with the amount of the impurities adhering on the wafers W.

Figure 9:
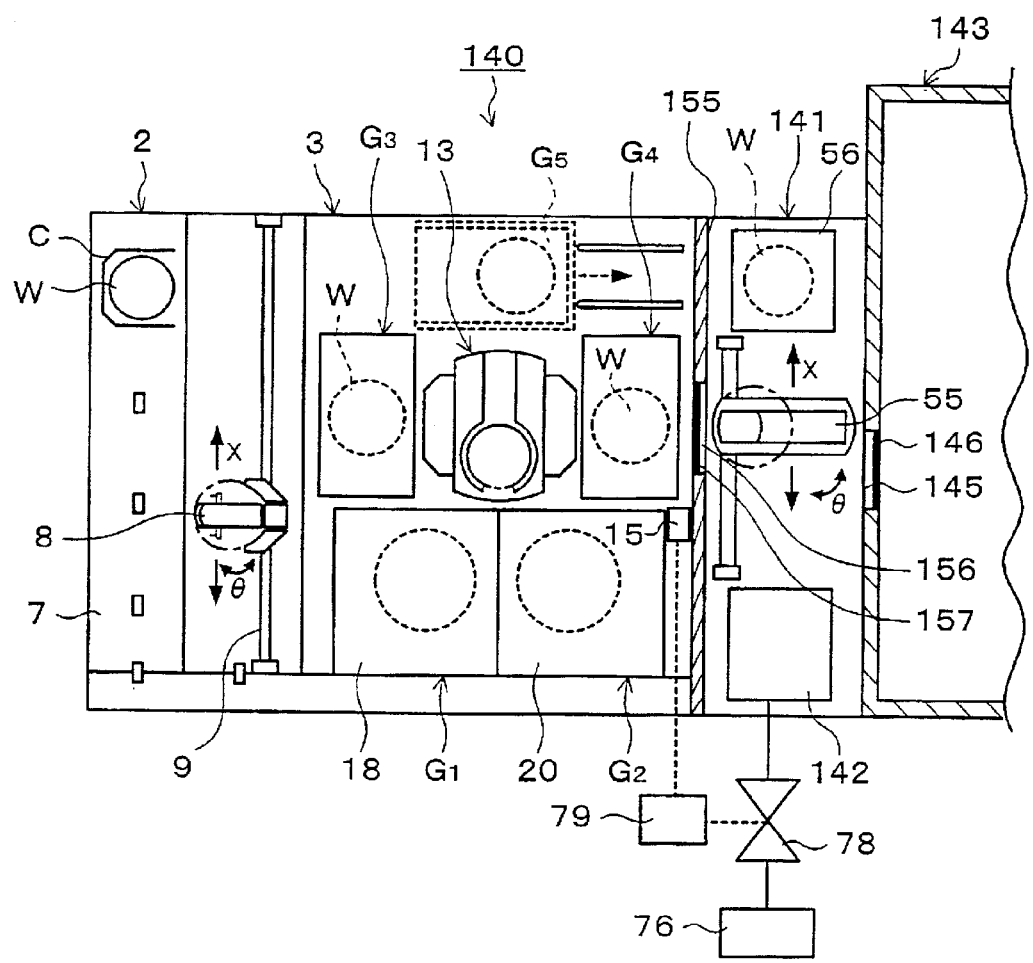
FIG. 9 is an explanatory plan view of the coating and developing treatment system when the reduced-pressure impurity removing unit is disposed in an interface section.

In the above described embodiments, the delivery section 6 is provided between the interface section 5 and the aligner 4, and in the delivery section 6 the reduced-pressure impurity removing unit 65 is provided, but the reduced-pressure impurity removing unit 65 may alternatively be provided in the interface section 5. In this case, as shown, for example, in FIG. 9, a reduced-pressure impurity removing unit 142 is disposed in the front side of an interface section 141 in a coating and developing treatment system 140 and in the position to which the wafer carrier 55 can get access. An aligner 143 is disposed adjacent to the interface section 141, and in its casing 143*a*, a single passage port 145 and a shutter 146 for allowing the passage port 145 to open and close freely are provided.

Figure 10:
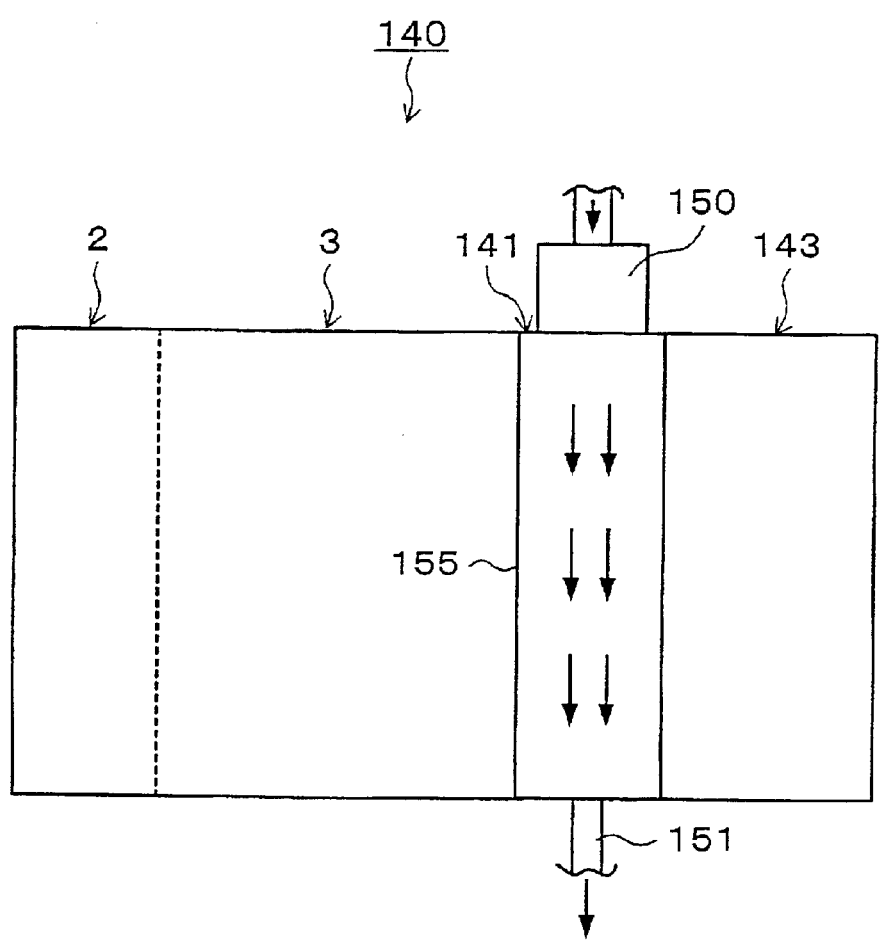
FIG. 10 is an explanatory view of a vertical cross section showing the flow of inert gas supplied to the interface section of the coating and developing treatment system in FIG. 9.

As shown in FIG. 10, on the top side of the interface section 141, a gas supply unit 150 is provided, and on the bottom side of the interface section 141, an exhaust duct 151 for exhausting the atmosphere inside the interface section 141 is provided, so that a purified inert gas is supplied into the interface section 141 and the impurities are purged to keep the atmosphere inside the interface 141 clean.

Furthermore, between the interface section 141 and the processing station 3, a partition plate 155 for insulating the atmosphere inside the interface section 141 from that inside the processing station 3 is provided. In the position in the partition plate 155 opposite to the extension units 41 and 42 included in the fourth processing unit group G4, a passage port 156 and a shutter 157 for allowing the passage port 156 to open and close freely are provided to prevent the atmosphere inside the processing station 3 from flowing into the interface section 141.

In the coating and developing treatment system 140 as structured above, the set pressure and the pressure-reducing time for the reduced-pressure chamber S of the reduced-pressure impurity removing unit 142 may be adjusted based on the impurity density measured by the density measuring unit 15, in a similar manner as in the above described first embodiment.

Disposing the reduced-pressure impurity removing unit 142 in the interface section 141 makes it possible to make a coating and developing treatment system smaller compared with that in the above described embodiment since a unit for removing impurities from the wafer W can be mounted in a coating and developing treatment system which is the same in size as a conventional one.

Figure 11:
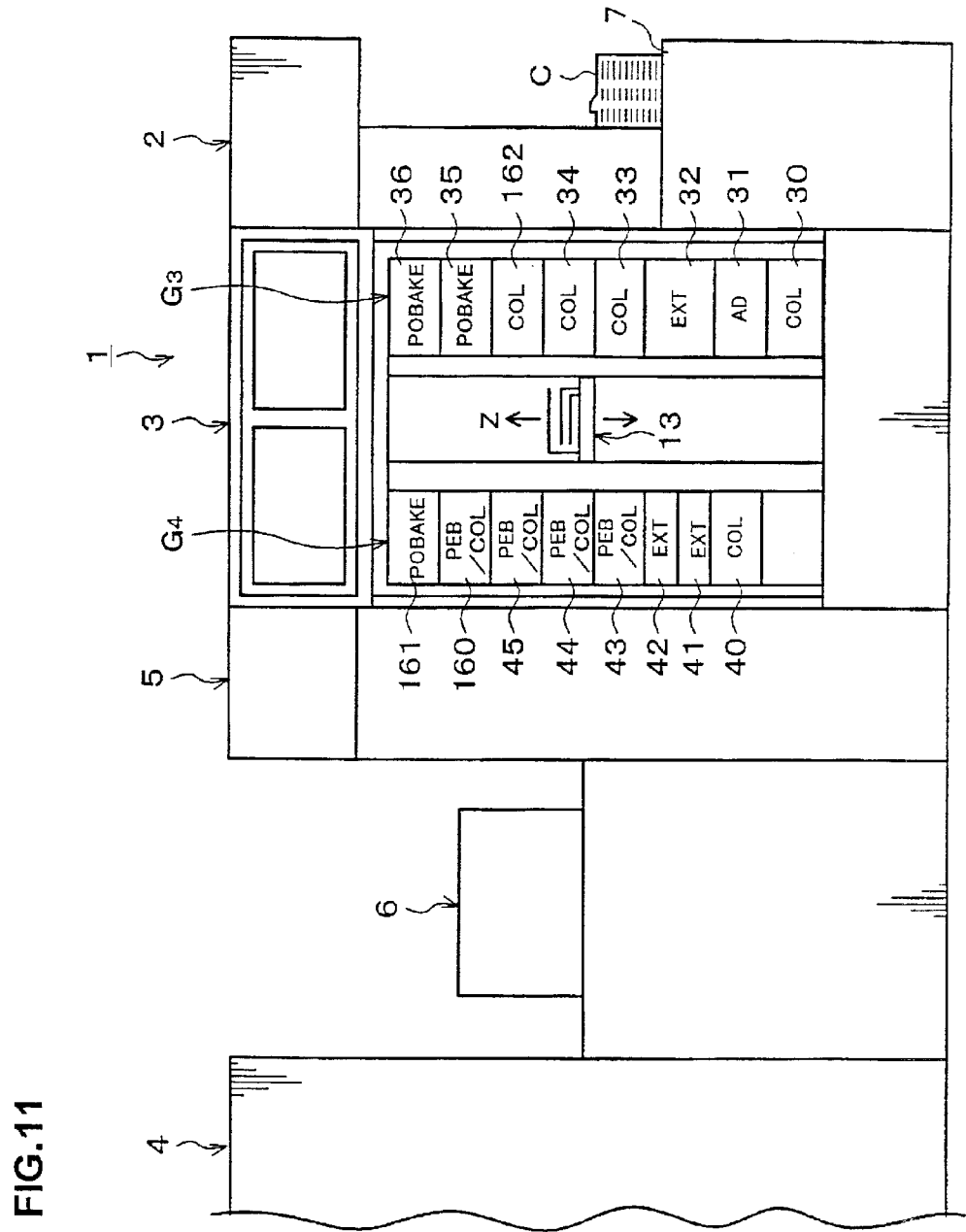
FIG. 11 is an explanatory view showing a layout example of the heat and cooling treatment unit inside the coating and developing treatment system when a vaporizing processing for a solvent in a resist solution is performed in the reduced-pressure impurity removing unit.

Furthermore, in the coating and developing treatment system 1 or 140 in the above described embodiments, the process of vaporizing a solvent in a resist solution carried out in the heat and cooling treatment units 46 and 47 may be performed simultaneously with the process of removing impurities carried out in the reduced-pressure impurity removing unit 65 or 142. In this case, as shown, for example, in FIG. 11, instead of the heat and cooling treatment units 46 and 47 (PRE/COL), a heat and cooling treatment unit 160 (PEB/COL) for performing a heat and cooling treatment after the exposure processing and a heat treatment unit 161 for performing the heat treatment after the developing treatment are provided in the fourth processing unit group G4 of the processing station 3, and a cooling treatment unit 162 for performing the cooling treatment for the wafer W after the heat treatment after the exposure treatment is provided in the third processing group G3.

When the impurities adhering onto the wafer W are removed in the reduced-pressure impurity removing unit 65, the pressure of the reduced-pressure chamber S is reduced to a predetermined pressure, for example, 133 Pa, at which moisture and the solvent in the resist solution are both vaporized, to simultaneously vaporize the solvent in the resist solution and the moisture, which is an impurity. Thereby, a solvent vaporizing process and an impurity removing process can be both carried out at the same time.

Therefore, the processes conventionally carried out in the heat and cooling treatment units 46 and 47 can be performed in the reduced-pressure impurity removing unit 65. Since another heat treatment unit can be added instead of a unit for the solvent vaporizing process as described above, processing performance in the processing station 3 is enhanced. Incidentally, when the heat and cooling treatment units 46 and 47 are omitted without adding another heat treatment unit, the number of heat treatment units can also be decreased, which makes it possible to make the processing station 3 small as a whole.

The embodiments described above relates to the coating and developing treatment system for the wafer W in the photolithography processes in semiconductor wafer device fabrication processes, but the present invention can also be applicable to a coating and developing treatment system for a substrate other than a semiconductor wafer, for example, an LCD substrate.

According to the present invention, impurities at a molecule level such as moisture, vapor, oxygen, ozone, organic substance, and so on and impurities such as fine particles adhering to a coating layer of the substrate can be removed before the exposure processing, the exposure processing can be performed in a preferable condition without being influenced by these impurities, thereby improving yields. Moreover, the solvent in the coating solution can be vaporized at the same time with the impurity removing process, thereby improving a throughput.

Furthermore, since the predetermined pressure and the predetermined time for reducing pressure, or the speed for reducing pressure are adjusted based on the impurity density measured at a predetermined position, impurities such as moisture, oxygen, and so on adhering on the substrate can be removed under a preferable minimum requirement condition according to the amount of the adhering impurities. Therefore, impurities giving adverse effect on treatments can be removed from the substrate in a preferable condition, and thereby the improvement in yields can be realized.

What is claimed is:

1. A coating and developing treatment system for performing a coating and developing treatment for a substrate, comprising:

a processing zone having a coating treatment unit for forming a coating layer on the substrate, a developing treatment unit for performing a developing treatment for the substrate, and a heat treatment unit for performing a heat treatment for the substrate;

an interface section for carrying the substrate between said processing zone and an aligner not included in the system for performing an exposure processing for the substrate;

a density measuring unit for measuring the density of impurities at least inside said processing zone or said interface section;

a reduced-pressure impurity removing unit having a chamber which can be closed airtightly for reducing the pressure inside the chamber to a predetermined pressure before the substrate undergoes the exposure processing to remove the impurities adhering to the coating layer on the substrate inside the chamber for a predetermined time;

a reduced-pressure control unit for controlling at least the predetermined pressure or predetermined time based on the value measured by said density measuring unit; and a controller for classifying the density of the impurities into predetermined density ranges, storing the predetermined pressure and the predetermined time corresponding to the respective density ranges, and controlling said reduced-pressure control unit to adjust the predetermined pressure and the predetermined time to equal to the stored predetermined pressure and predetermined time corresponding to the predetermined density range to which the measured value belongs.

2. A coating and developing treatment system for performing a coating and developing treatment for a substrate, comprising:

a processing zone having a coating treatment unit for forming a coating layer on the substrate, a developing treatment unit for performing a developing treatment for the substrate, and a heat treatment unit for performing a heat treatment for the substrate;

an interface section for carrying the substrate between said processing zone and an aligner not included in the system for performing an exposure processing for the substrate;

a density measuring unit for measuring the density of impurities at least inside said processing zone or said interface section;

a reduced-pressure impurity removing unit having a chamber which can be closed airtightly for reducing the pressure inside the chamber to a predetermined pressure before the substrate undergoes the exposure processing to remove the impurities adhering to the coating layer on the substrate inside the chamber for a predetermined time; and a reduced-pressure control unit for controlling at least the predetermined pressure or predetermined time based on the value measured by said density measuring unit, wherein said reduced-pressure control unit also controls pressure-reducing speed at the time of reducing the pressure of the chamber to the predetermined pressure, also based on the value measured by said density measuring unit.

3. A coating and developing treatment system for performing a coating and developing treatment for a substrate, comprising:

a processing zone having a coating treatment unit for forming a coating layer on the substrate, a developing treatment unit for performing a developing treatment for the substrate, and a heat treatment unit for performing a heat treatment for the substrate;

an interface section for carrying the substrate between said processing zone and an aligner not included in the system for performing an exposure processing for the substrate;

a casing for accommodating said processing zone and said interface section;

a density measuring unit for measuring the density of impurities inside a clean room which is disposed outside said casing and in which the system is placed;

a reduced-pressure impurity removing unit having a chamber which can be closed airtightly for reducing the pressure inside the chamber to a predetermined pressure before the substrate undergoes the exposure processing to remove the impurities adhering to the coating layer on the substrate inside the chamber for a predetermined time;

a reduced-pressure control unit for controlling at least the predetermined pressure or the predetermined time of said reduced-pressure impurity removing unit based on the value measured by said density measuring unit; and a controller for classifying the density of the impurities into predetermined density ranges, storing the predetermined pressure and the predetermined time corresponding to the respective density ranges, and controlling said reduced-pressure control unit to adjust the predetermined pressure and the predetermined time to equal to the stored predetermined pressure and predetermined time corresponding to the predetermined density range to which the measured value belongs.

4. A coating and developing treatment system for performing a coating and developing treatment for a substrate, comprising:

a processing zone having a coating treatment unit for forming a coating layer on the substrate, a developing treatment unit for performing a developing treatment for the substrate, and a heat treatment unit for performing a heat treatment for the substrate;

an interface section for carrying the substrate between said processing zone and an aligner not included in the system for performing an exposure processing for the substrate;

a casing for accommodating said processing zone and said interface section;

a density measuring unit for measuring the density of impurities inside a clean room which is disposed outside said casing and in which the system is placed;

a reduced-pressure impurity removing unit having a chamber which can be closed airtightly for reducing the pressure inside the chamber to a predetermined pressure before the substrate undergoes the exposure processing to remove the impurities adhering to the coating layer on the substrate inside the chamber for a predetermined time; and a reduced-pressure control unit for controlling at least the predetermined pressure or the predetermined time of said reduced-pressure impurity removing unit based on the value measured by said density measuring unit, wherein said reduced-pressure control unit also controls pressure-reducing speed at the time of reducing the pressure of the chamber to the predetermined pressure, also based on the value measured by said density measuring unit.

5. A coating and developing treatment system for performing a coating and developing treatment for a substrate, comprising:

a processing zone having a coating treatment unit for forming a coating layer on the substrate, a developing treatment unit for performing a developing treatment for the substrate, and a heat treatment unit for performing a heat treatment for the substrate;

an interface section for carrying the substrate between said processing zone and an aligner not included in the system for performing an exposure processing for the substrate;

a density measuring unit for measuring the density of impurities at least inside said processing zone or said interface section;

a reduced-pressure impurity removing unit having a chamber which can be closed airtightly for reducing the pressure inside the chamber to a predetermined pressure before the substrate undergoes the exposure processing to remove the impurities adhering to the coating layer on the substrate inside the chamber for a predetermined time; and a reduced-pressure control unit for controlling pressure-reducing speed of the reduced-pressure impurity removing unit based on the value measured by said density measuring unit.

6. A coating and developing treatment system for performing a coating and developing treatment for a substrate, comprising:

a processing zone having a coating treatment unit for forming a coating layer on the substrate, a developing treatment unit for performing a developing treatment for the substrate, and a heat treatment unit for performing a heat treatment for the substrate;

an interface section for carrying the substrate between said processing zone and an aligner not included in the system for performing an exposure processing for the substrate;

a casing for accommodating said processing zone and said interface section;

a density measuring unit for measuring the density of impurities inside a clean room which is disposed outside said casing and in which the system is placed;

a reduced-pressure impurity removing unit having a chamber which can be closed airtightly for reducing the pressure inside the chamber to a predetermined pressure before the substrate undergoes the exposure processing to remove the impurities adhering to the coating layer on the substrate inside the chamber for a predetermined time; and a reduced-pressure control unit for controlling pressure-reducing speed of said reduced-pressure impurity removing unit based on the value measured by said density measuring unit.

7. A coating and developing treatment system according to claim 1, wherein said interface section and the aligner are connected with each other via a delivery section and said reduced-pressure impurity removing unit is disposed in the delivery section.

8. A coating and developing treatment system according to claim 4, wherein the delivery section has a first path along which the substrate passes when carried from said interface section to the aligner; and a second path along which the substrate passes when carried from the aligner to said interface section, and said reduced-pressure impurity removing unit is disposed in the first path.

9. A coating and developing treatment system according to claim 1, wherein said reduced-pressure impurity removing unit is disposed in said interface section.

* * * * *